United States Patent
Aoki (10) Patent No.: US 10,777,272 B2
(45) Date of Patent: Sep. 15, 2020

(54) SEMICONDUCTOR MEMORY DEVICE

(71) Applicant: Winbond Electronics Corp., Taichung (TW)

(72) Inventor: Hajime Aoki, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/249,907

(22) Filed: Jan. 17, 2019

(65) Prior Publication Data

US 2019/0252019 A1  Aug. 15, 2019

(30) Foreign Application Priority Data

Feb. 14, 2018 (JP) .................. 2018-024250

(51) Int. Cl.
*G11C 13/00* (2006.01)
*G11C 11/16* (2006.01)
*G11C 7/14* (2006.01)

(52) U.S. Cl.
CPC .............. *G11C 13/004* (2013.01); *G11C 7/14* (2013.01); *G11C 11/1659* (2013.01); *G11C 11/1673* (2013.01); *G11C 13/003* (2013.01); *G11C 13/0069* (2013.01); *G11C 13/0026* (2013.01); *G11C 13/0028* (2013.01); *G11C 2013/0042* (2013.01); *G11C 2013/0054* (2013.01);
(Continued)

(58) Field of Classification Search
CPC ... G11C 13/0004; G11C 7/14; G11C 11/1659; G11C 11/1673; G11C 13/003; G11C 13/0069

USPC ......................................................... 365/148
See application file for complete search history.

(56) References Cited

U.S. PATENT DOCUMENTS 8,325,508 B2    12/2012   Kawai et al.
8,873,273 B2 *  10/2014   Ueda ................ G11C 11/16
                                                  365/148
(Continued)

FOREIGN PATENT DOCUMENTS

CN    103839585    6/2014
JP     5748877     7/2015
(Continued)

OTHER PUBLICATIONS

"Office Action of Taiwan Counterpart Application", dated Apr. 23, 2019, pp. 1-5.
(Continued)

*Primary Examiner* — Xiaochun L Chen
(74) *Attorney, Agent, or Firm* — JCIPRNET (57) ABSTRACT

The disclosure provides a semiconductor memory device that improves the reliability of data reading and achieves good area efficiency. A variable resistance memory of the disclosure includes a memory array, a row decoder, a column decoder, a writing part, and a reading part. The memory array includes a plurality of memory cells. The row decoder selects the memory cells in a row direction. The column decoder selects the memory cells in a column direction. The writing part writes identical data to a pair of memory cells that is selected. The reading part reads the data stored in the pair of memory cells that is selected. The reading part includes a sense amplifier that compares a total of the currents respectively flowing through the pair of memory cells with a reference value.

11 Claims, 4 Drawing Sheets

(52) U.S. Cl.
CPC ...... *G11C 2213/32* (2013.01); *G11C 2213/79* (2013.01); *G11C 2213/82* (2013.01)

(56) References Cited

U.S. PATENT DOCUMENTS

| | | | |
|---|---|---|---|
| 2008/0316802 A1* | 12/2008 | Happ | G11C 7/14 |
| | | | 365/163 |
| 2012/0224412 A1* | 9/2012 | Ueda | G11C 11/16 |
| | | | 365/148 |
| 2015/0348624 A1 | 12/2015 | Jang et al. | |
| 2016/0148686 A1* | 5/2016 | Hsu | G11C 13/0069 |
| | | | 365/63 |

FOREIGN PATENT DOCUMENTS

| | | |
|---|---|---|
| KR | 1020120063736 | 6/2012 |
| TW | 200303019 | 8/2003 |
| TW | 200715291 | 4/2007 |
| TW | I503842 | 10/2015 |

OTHER PUBLICATIONS

"Office Action of Korea Counterpart Application," dated Jan. 9, 2020, p. 1-p. 8.

* cited by examiner

SEMICONDUCTOR MEMORY DEVICE

CROSS-REFERENCE TO RELATED APPLICATION

This application claims the priority benefit of Japan application serial no. 2018-024250, filed on Feb. 14, 2018. The entirety of the above-mentioned patent application is hereby incorporated by reference herein and made a part of this specification.

BACKGROUND

Technical Field

The disclosure relates to a semiconductor memory device, and more particularly relates to a reading method for a variable resistance random access memory that uses a variable resistance element.

Description of Related Art

A variable resistance memory stores data by applying a pulse voltage to a variable resistance element and reversibly and non-volatilely setting the variable resistance element to a high resistance state or a low resistance state. The variable resistance element is composed of a thin film of a metal oxide, such as hafnium oxide (HfOx), and enters the low resistance state or the high resistance state according to the value and polarity of the applied pulse voltage, for example (Japanese Patent No. 5748877). For example, writing the variable resistance element to the low resistance state is called SET, whereas writing the variable resistance element to the high resistance state is called RESET (and vice versa). There are two types of variable resistance memories. i.e., the unipolar type and the bipolar type. For the unipolar type, the write voltages applied to the variable resistance element during set and reset have the same polarity, and the set or reset is performed by changing the write voltage. For the bipolar type, the polarities of the write voltages applied to the variable resistance element during set and reset are reversed. That is, the write voltages are applied to the variable resistance element in two directions.

Figure 1:
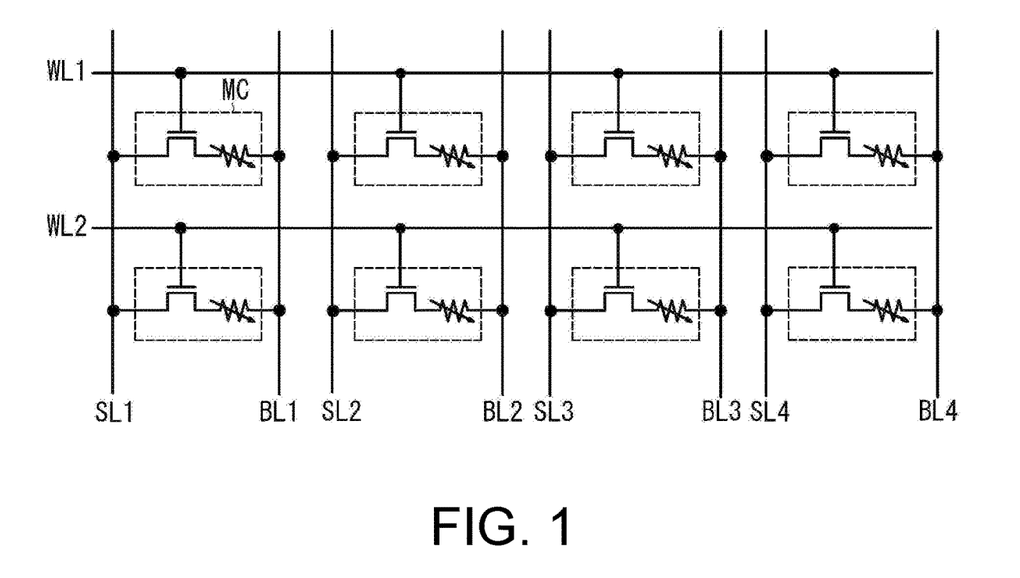
FIG. 1 is a schematic diagram of the conventional variable resistance random access memory.

FIG. 1 shows a schematic configuration of the variable resistance memory. A variable resistance element and an access transistor are connected in series with one source line SL1. The memory cell MC can be selected in the unit of bits. At the time of writing, for example, the access transistors in the row direction are selected via the word line WL1 and a write pulse voltage is applied between the bit line BL1 and the source line SL1, so as to set or reset the variable resistance element. At the time of reading, the access transistors in the row direction are selected via the word line WL1 and a reading voltage is applied to the bit line BL1 and the source line SL1, and a current or voltage corresponding to set or reset, which flows through the variable resistance element, is detected by a sense amplifier. Similarly, the above description with respect to the source line SL1 also applies to a source line SL2, a source line SL3, or a source line SL4, and correspondingly the above description with respect to the bit line BL1 also applies to a bit line BL2, a bit line BL3, or a bit line BL4. Further, the above description with respect to the word line WL1 also applies to a word line WL2.

In addition, when a thin film of a metal oxide, such as hafnium oxide (HfO$_x$) and titanium oxide (TiO$_x$), is used as the material of the variable resistance element, the metal oxide is applied with a forming operation as the initial setting. Generally, the forming operation puts the variable resistance element, for example, in the low resistance state, i.e., a state close to set, by applying a voltage somewhat greater than the voltage for writing the variable resistance element to the thin film.

Figure 2:
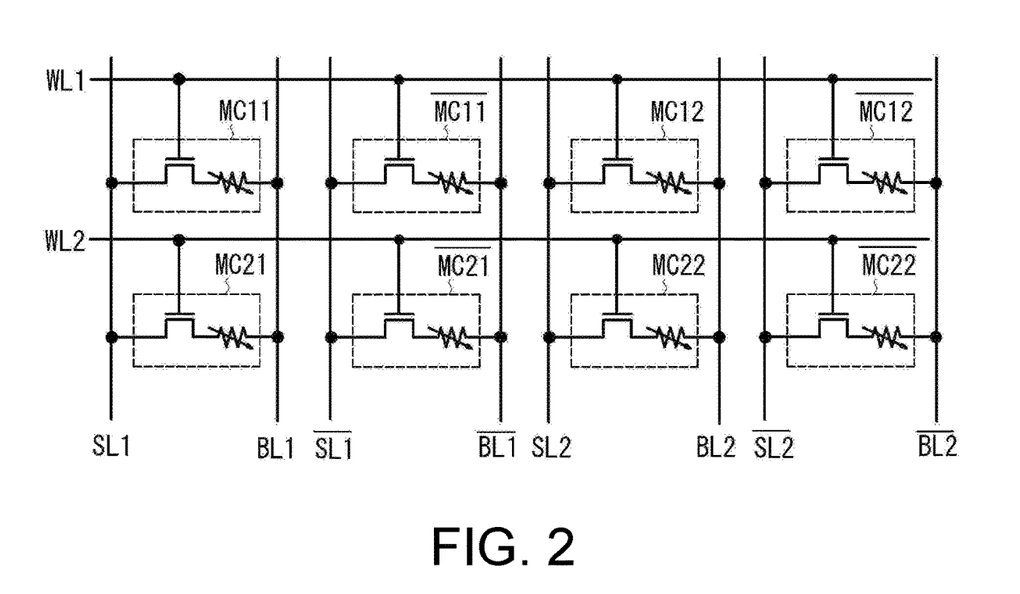
FIG. 2 is a diagram illustrating a 2T×2R configuration of the conventional variable resistance random access memory for writing complementary data.

There is a variable resistance memory that stores complementary data in a pair of memory cells by two variable resistance elements and two access transistors, that is, so-called 2T×2R configuration. FIG. 2 shows an outline of a 2T×2R memory array. The memory cell MC11 includes a variable resistance element and an access transistor between the source line SL1 and the bit line BL1 and writes true data to the variable resistance element. The memory cell/MC11 includes a variable resistance element and an access transistor between the source line/SL1 and the bit line/BL1 and writes complementary data to the variable resistance element. Similarly, the above description with respect to the source line SL1 also applies to the source line/SL1, the source line SL2, or a source line/SL2, and the above description with respect to the bit line BL1 also applies to the bit line/BL1, a bit line BL2, or a bit line/BL2. In addition, the above description with respect to the word line WL1 also applies to the word line WL2, and the above description with respect to the memory cell MC11 and the memory cell/MC11 also applies to a memory cell MC12, a memory cell/MC12, a memory cell MC21, a memory cell/MC21, or a memory cell/MC22.

Figure 3:
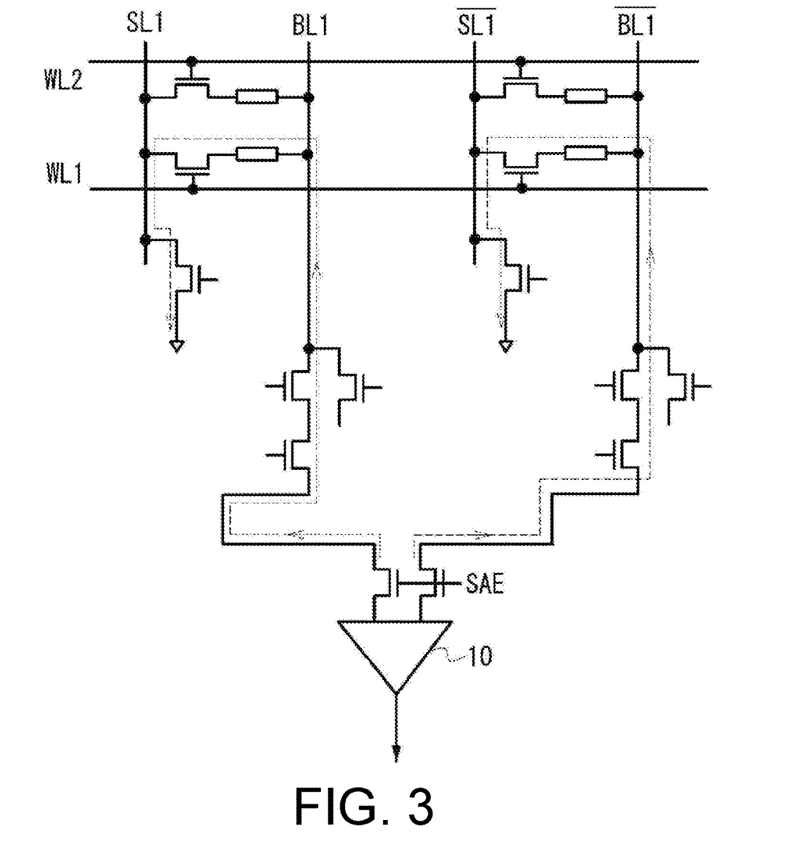
FIG. 3 is a diagram illustrating the reading method for data of the conventional 2T×2R.

Reading data from the 2T×2R memory cells is to detect a differential signal between the current flowing through the variable resistance element that stores the true data and the current flowing through the variable resistance element that stores the complementary data. FIG. 3 shows an example of reading data from a pair of memory cells MC11 and/MC11. The word line WL1 is selected by a row decoder (not shown), the bit lines BL1 and/BL1 and the source lines SL1 and/SL1 are selected by a column decoder, and a reading voltage is applied to the selected bit lines and source lines. The bit line BL1 of the memory cell MC11 that stores the true data is coupled to one input of the sense amplifier 10, and the bit line/BL1 of the memory cell/MC11 that stores the complementary data is coupled to the other input of the sense amplifier 10. The source lines SL1 and/SL1 are coupled to the ground voltage (GND).

It is assumed that the memory cell MC11 is set (data "1") and the memory cell/MC11 is reset (data "0"), for example. In this case, the variable resistance element of the memory cell MC11 is in the low resistance state, and a relatively large current flows to the source line SL1 from the bit line BL1. Meanwhile, the variable resistance element of the memory cell/MC11 is in the high resistance state, and a relatively small current flows to the source line/SL1 from the bit line/BL1. The sense amplifier 10 is activated by an enable signal SAE, detects the differential signal between the current flowing through the memory cell MC11 and the current flowing through the memory cell/MC11, and outputs data "1" according to the detection result. By reading such a differential signal, it is possible to perform reading with higher reliability than reading of a single bit with 1T×1R, and to achieve high-speed access.

Figure 4:
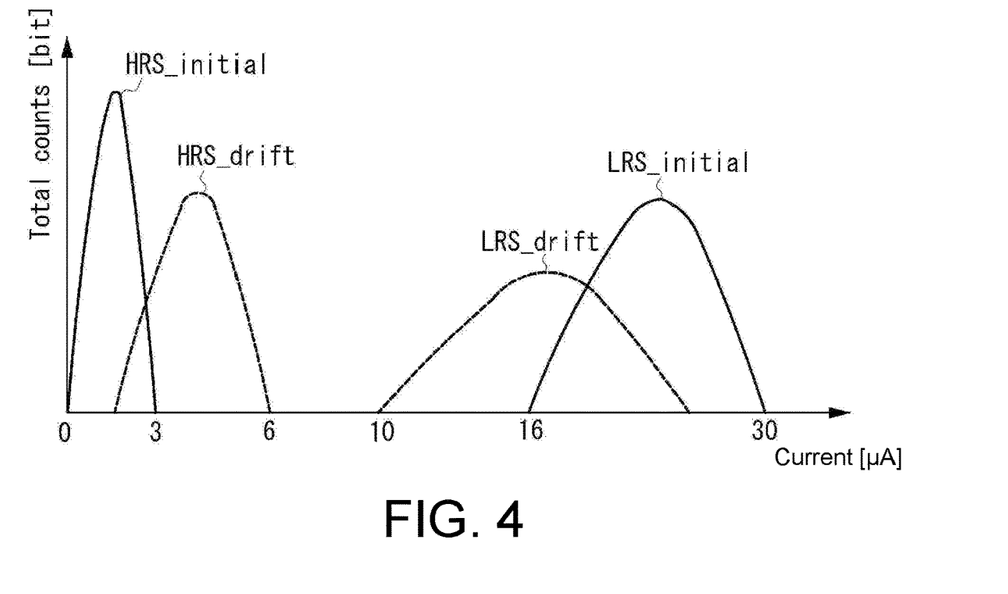
FIG. 4 is a diagram showing an example that a tail bit shift occurs in a current distribution during set/reset.

FIG. 4 shows an exemplary distribution of the currents flowing through the variable resistance element during set/reset. In the initial state (or a normal state), a relatively large read margin is present between the current distribution HRS_initial that flows during set and the current distribution LRS_initial that flows during reset, and the sense amplifier 10 can correctly read the differential signal of a pair of memory cells. However, as the number of times of writing to the variable resistance element increases and the retention or endurance characteristic of the data deteriorates, that is, the filamentous current path formed between the electrodes of the variable resistance element deteriorates, resulting in tail bit shifts, as indicated by the current distribution HRS_drift and the current distribution LRS_drift. When the tail bit shifts occur, the read margin between the upper limit value of the current distribution HRS_drift and the lower limit value of the current distribution LRS_drift becomes narrow, which may cause a data reading error.

For example, it is assumed that the upper limit value of the current distribution HRS_initial in the initial state is 3 μA and the lower limit value of the current distribution LRS_initial is 16 μA.
(1) When data "0" is stored:
3 μA flows through the memory cell MC11 that stores the true data and 16 μA flows through the memory cell/MC11 that stores the complementary data. The current difference between them is 13 μA, and the sense amplifier 10 outputs data "0" according to a good detection result of the differential signal.
(2) When data "1" is stored:
16 μA flows through the memory cell MC11 that stores the true data and 3 μA flows through the memory cell/MC11 that stores the complementary data. The current difference between them is 13 μA. and the sense amplifier 10 outputs data "1" according to a good detection result of the differential signal.

Here, it is assumed that a tail bit shift occurs in the memory cell MC11, and the upper limit value of the current distribution HRS_drift is 6 μA (a shift of +3 μA) and the lower limit value of the current distribution LRS_drift is 10 μA (a shift of −6 μA).
(1) When data "0" is stored:
6 μA flows through the memory cell MC11 and 161A flows through the memory cell/MC11. The current difference between them is 10 μA. and the sense amplifier 10 outputs data "0" according to a good detection result of the differential signal.
(2) When data "1" is stored:
10 μA flows through the memory cell MC11 and 3 μA flows through the memory cell/MC11. The current difference between them is 7 μA. When the margin becomes small, the sense amplifier 10 may not be able to correctly detect the differential signal, that is, the sense amplifier 10 may not be able to correctly output the data "1".

For the above reason, the variable resistance memory is provided with an ECC circuit for error detection/correction. However, execution of the ECC processing will cause the reading speed to drop, and the ECC circuit needs to occupy a certain area on the chip. In particular, such problems become noticeable when there is a higher requirement for the capability (bit number) of detecting and correcting errors.

SUMMARY

The disclosure provides a semiconductor memory device that improves the reliability of data reading and achieves good area efficiency.

The semiconductor memory device according to the disclosure includes: a memory array including a plurality of memory cells; a writing part writing identical data to a pair of memory cells selected from the plurality of memory cells; and a reading part reading the data stored in the pair of memory cells selected from the plurality of memory cells, wherein the reading part includes a sense amplifier that compares a total of currents respectively flowing through the pair of memory cells with a reference value and outputs the data based on a comparison result.

In an embodiment, the writing part writes the identical data to a pair of memory cells adjacent in a row direction. In an embodiment, each of the memory cells includes a reversible and non-volatile variable resistance element and an access transistor connected to the variable resistance element, and the writing part sets or resets each variable resistance element of the pair of memory cells. In an embodiment, the memory array includes a dummy memory cell for generating the reference value. In an embodiment, the dummy memory cell is set to generate a current between a current flowing through a set variable resistance element and a current flowing through a reset variable resistance element. In an embodiment, the semiconductor memory device further includes a setting part that sets the reference value according to a retention characteristic or an endurance characteristic. In an embodiment, the semiconductor memory device includes a row selection part selecting the memory cells in a row direction based on address information and a column selection part selecting the memory cells in a column direction based on the address information, wherein the writing part writes identical data to a pair of memory cells selected by the row selection part and the column selection part, and the reading part reads data stored in a pair of memory cells selected by the row selection part and the column selection part.

A reading method for reading data of a semiconductor memory device according to the disclosure includes: writing identical data to a pair of memory cells selected from a plurality of memory cells included in a memory cell array; and comparing a total of currents respectively flowing through the pair of memory cells with a reference value and outputting data based on a comparison result when reading the data from the pair of memory cells.

In an embodiment, each of the memory cells includes a reversible and non-volatile variable resistance element and an access transistor connected to the variable resistance element. In an embodiment, each of the memory cells includes a variable resistance element, and the reference value is set to a current between a current flowing through a set variable resistance element and a current flowing through a reset variable resistance element. In an embodiment, the reference value is varied according to a retention characteristic or an endurance characteristic.

According to the disclosure, identical data is written to a selected pair of memory cells, and when the data is read from the selected pair of memory cells, the total of the currents respectively flowing through the pair of memory cells is compared with the reference value, and the data is outputted based on the comparison result. Therefore, compared with the conventional reading method, the disclosure can improve the reliability of data reading. As a result, it is possible to reduce the error detection/correction function for the read data and reduce the area it occupies.

DESCRIPTION OF THE EMBODIMENTS

Embodiments of the disclosure will be described hereinafter. A variable resistance random access memory is illustrated as an embodiment of the disclosure.

Figure 5:
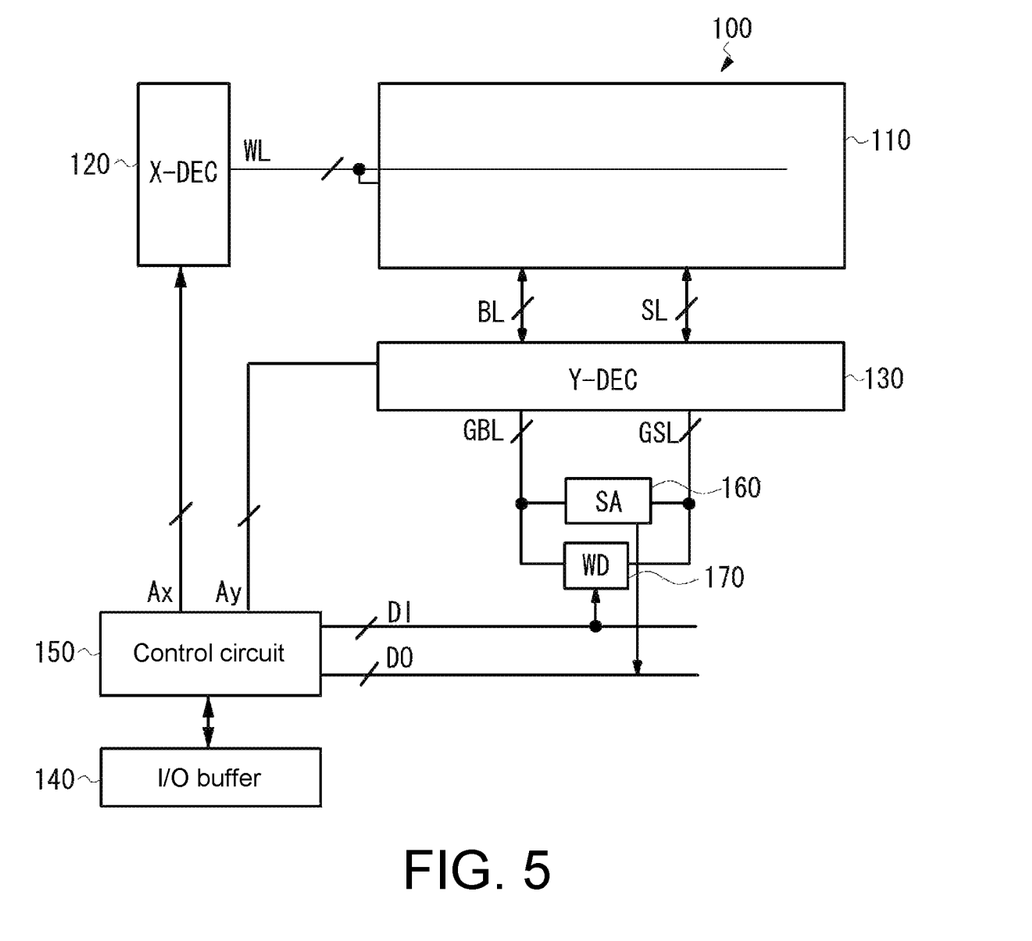
FIG. 5 is a diagram showing the configuration of a variable resistance random access memory according to an embodiment of the disclosure.

FIG. 5 is a block diagram showing a schematic configuration of the variable resistance random access memory according to an embodiment of the disclosure. The variable resistance memory 100 of this embodiment includes a memory array 110, a row decoder and drive circuit (X-DEC) 120, a column decoder (Y-DEC) 130, a control circuit 150, a sense amplifier 160, and a write driver/read bias circuit 170. In the memory array 110, a plurality of memory cells, including variable resistance elements and access transistors, are arranged in rows and columns. The row decoder and drive circuit 120 selects and drives a word line WL based on a row address Ax. The column decoder 130 selects a bit line BL and a source line SL based on a column address Ay. The control circuit 150 controls each part based on a command, an address, data, etc. received from outside via an I/O buffer 140. The sense amplifier 160 senses data read from the memory cell via the bit line BL and the source line SL. The write driver/read bias circuit 170 applies a bias voltage to the bit line BL or the source line SL in a read operation, applies a pulse voltage corresponding to write data in a write operation to the bit line BL or the source line SL, and applies a voltage for the read operation in the read operation to the bit line BL or the source line SL.

In this embodiment, as shown in FIG. 2, data is written and read by using a pair of memory cells of 2T×2R. However, unlike the related art that stores complementary data in a pair of memory cells, in this embodiment, identical data is stored in a pair of memory cells. For example, according to the example of FIG. 2, the memory cell MC11 and the memory cell/MC11 are set or reset to the same state, that is, identical data "1" or data "0" is written.

The sense amplifier 160 is connected to the control circuit 150 via an internal data bus DO, and the result sensed by sense amplifier 160 is outputted to the control circuit 150 via the internal data bus DO. Details of the sense amplifier 160 will be described later.

The write driver/read bias circuit 170 is connected to the control circuit 150 via an internal data bus DI and receives the write data via the internal data bus DI. When setting a selected pair of memory cells, for example, the write driver/read bias circuit 170 applies a positive voltage to a pair of bit lines BL, applies the ground voltage to a pair of source lines SL, and sets the variable resistance element of each of the pair of memory cells to a low resistance state. When resetting a selected pair of memory cells, the ground voltage is applied to the bit lines BL, a positive voltage is applied to the source lines SL, a current having a polarity opposite to that of set is applied to the variable resistance element, and the variable resistance element of each of the pair of memory cells is reset to a high resistance state.

The control circuit 150 performs control of reading and writing based on a command inputted from the outside via the I/O buffer 140. When a write operation is performed, the row decoder 120 selects the word line WL based on the inputted row address Ax. and the column decoder 130 selects a pair of bit lines BL and a pair of source lines SL based on the inputted column address Ay, thereby selecting a pair of memory cells. For example, according to the example of FIG. 2, the word line WL1 is selected based on the row address, and a pair of bit lines BL1 and/BL1 and a pair of source lines SL1 and/SL1 are selected based on the column address, which makes it possible to access the pair of memory cells MC11 and/MC11. In addition, the write driver/read bias circuit 170 applies a bias voltage to the selected bit line and source line via a global bit line GBL and a global source line GSL based on inputted write data, and writes identical data "0" or identical data "1" to the selected pair of memory cells.

When a read operation is performed, the row decoder 120 selects the word line WL based on the inputted row address Ax, and the column decoder 130 selects a pair of bit lines BL and a pair of source lines SL based on the inputted column address Ay, thereby selecting a pair of memory cells. In addition, the write driver/read bias circuit 170 applies a reading bias voltage to the selected bit line and source line via the global bit line GBL and the global source line GSL. The sense amplifier 160 senses the data read from the selected pair of memory cells and outputs a result of the sensing to the control circuit 150.

Figure 6:
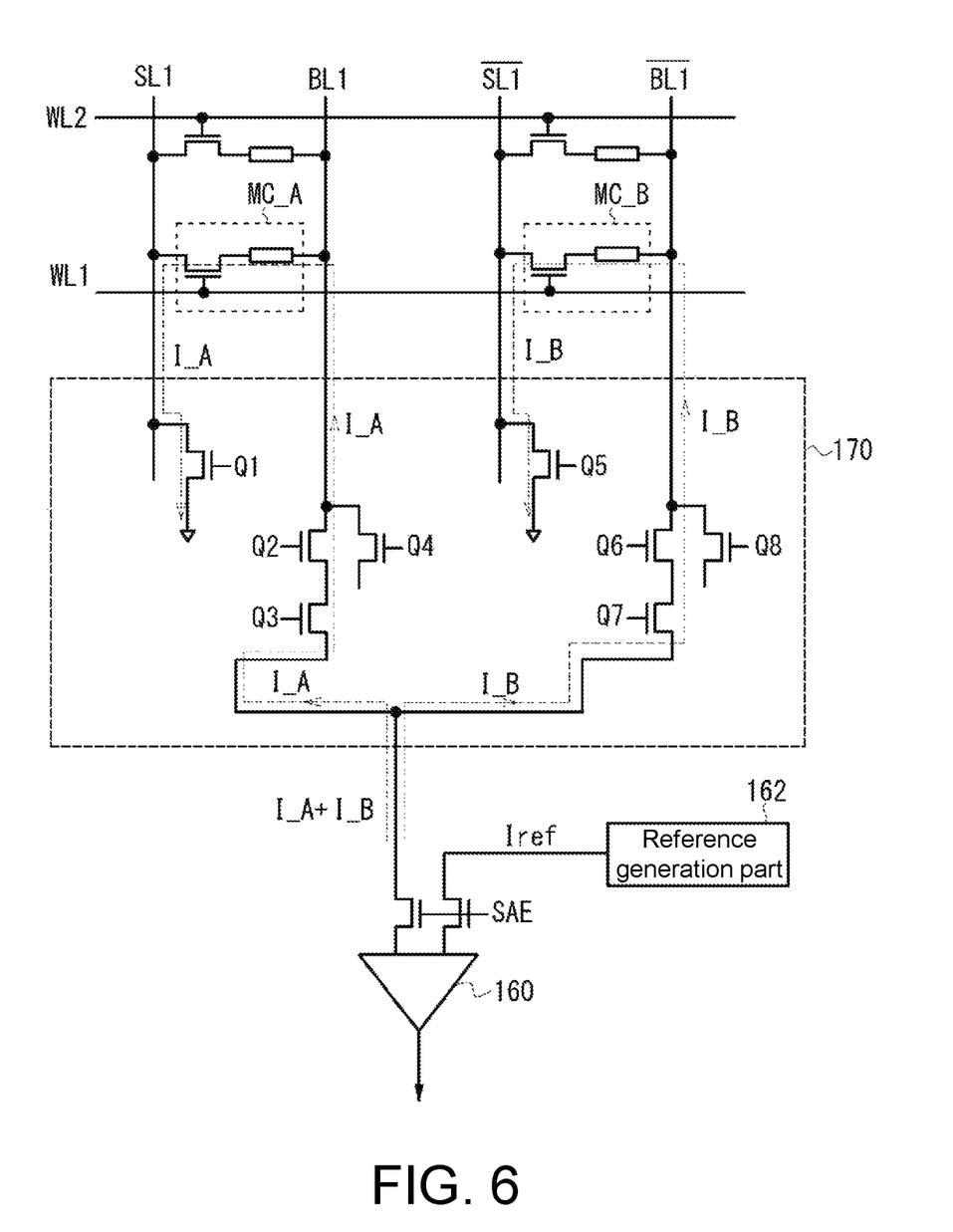
FIG. 6 is a diagram illustrating a reading method according to an embodiment of the disclosure.

Next, a data reading method according to this embodiment is described with reference to FIG. 6. In this example, the word line WL1 is selected by the row decoder 120, and a group of bit line BL1 and source line SL1 and another group of bit line/BL1 and source line/SL1 are selected by the column decoder 130, and a pair of memory cells MC_A and MC_B is selected.

As described above, identical data is written to the pair of memory cells MC_A and MC_B. In the read operation, the write driver/read bias circuit 170 controls the transistors Q1 to Q8 according to an instruction from the control circuit 150, and applies a reading bias voltage to the selected bit line BL1 and source line SL1 and the selected bit line/BL1 and source line/SL1.

The selected bit line BL1 and bit line/BL1 are coupled to one input of the sense amplifier 160, and a reference generation part 162 for generating a reference current Iref is coupled to the other input. The sense amplifier 160 is activated in response to a sense enable signal SAE from the control circuit 150, to compare voltages corresponding to the currents that flow to the respective inputs, and outputs a comparison result thereof.

The access transistor is turned on via the word line WL1, the reading voltage is applied to the memory cells MC_A and MC_B via the bit line, and the currents I_A and I_B corresponding to set or reset of the variable resistance elements flow through the memory cells MC_A and MC_B from the bit line toward the source line. If the memory cells MC_A and MC_B are in the normal state, that is, before a tail bit shift occurs, ideally I_A is equal to I_B. At one input of the sense amplifier 160, a total current of the current I_A and the current I_B or a voltage representing the total current thereof is generated.

In this embodiment, the reference current Iref may be set between the upper limit value of the current distribution HRS_initial and the lower limit value of the current distribution LRS_initial, as shown in FIG. 4. The reference generation part 162 can be of any configuration and is configured, for example, by using a replica (dummy) of the memory cell, a current source circuit, a resistor, a transistor, etc. for generating the reference current Iref. Moreover, in an embodiment, the reference generation part 162 may vary the reference current Iref according to an instruction from the control circuit 150. For example, the control circuit 150 can set the reference current Iref according to a retention or endurance characteristic of the variable resistance element. For example, the control circuit 150 can count the number of times of rewriting the variable resistance memory 100, retains the count result in a non-volatile storage area, and varies the reference current Iref according to the number of times of rewriting. When the reference generation circuit 162 is configured by using a dummy memory cell, the write driver/read bias circuit 170 may program the dummy memory cell, so that the resistance of the variable resistance element is variable. Alternatively, the reference current Iref may be varied by controlling an operating voltage (e.g., gate voltage) of the access transistor of the dummy memory cell. In another embodiment, the control circuit 150 may change the setting value of the reference current Iref according to a user command from the outside.

The conventional sense amplifier 10 compares the current flowing through the memory cell that stores the true data and the current flowing through the memory cell that stores the complementary data, so as to sense the data stored in a pair of memory cells. In the disclosure, however, the sense amplifier 160 compares the total of the current I_A flowing through the memory cell MC_A and the current I_B flowing through the memory cell MC_B with the reference current Iref, so as to sense the data stored in the pair of memory cells MC_A and MC_B, and outputs the result of the sensing.

Here, an example of performing reading on the variable resistance random access memory under the same current distribution condition as that exemplified in FIG. 4 is described below. It is assumed that, in the initial state, the upper limit value of the current distribution HRS_initial is 3 μA and the lower limit value of the current distribution LRS_initial is 16 μA.

(1) When data "0" is stored:
3 μA flows through the memory cell MC_A and 3 μA flows through the memory cell MC_B, and the total current thereof is 6 μA.

(2) When data "1" is stored:
16 μA flows through the memory cell MC_A and 16 μA flows through the memory cell MC_B. and the total current thereof is 32 μA.

At this time, the window width for data "0" and data "1" is 26 μA (32 μA–6 μA), and the reference current Iref is set in this range.

It is assumed that a tail bit shift occurs in the memory cell MC_A, and the upper limit value of the current distribution HRS_drift is 6 μA (a shift of +3 μA) and the lower limit value of the current distribution LRS_drift is 10 μA (a shift of −6 μA).

(1) When data "0" is stored:
6 μA flows through the memory cell MC_A and 3 μA flows through the memory cell MC_B, and the total current thereof is 9 μA.

(2) When data "1" is stored:
10 μA flows through the memory cell MC_A and 16 μA flows through the memory cell MC_B, and the total current thereof is 26 μA.

At this time, even though a tail bit shift occurs in one memory cell MC_A, the window width for data "0" and data "1" is 17 μA (26 μA–9 μA), and the reference current Iref may be set to 17.5 μA (9 μA+8.5 μA) (½ window width). It can be seen that this read margin is larger than that of the conventional reading method.

According to the embodiment of the disclosure, when the retention characteristic or endurance characteristic of one memory cell deteriorates and a tail bit shift occurs, the data stored therein can be determined by comparing the total of the currents respectively flowing through the pair of memory cells with a reference value. Therefore, compared with the conventional variable resistance random access memory, the read margin can be made larger and the reliability of data reading can be improved. As a result, the requirement for the ECC circuit can be reduced, and the size of the ECC circuit and the area it occupies can be reduced to increase the integration of the memory cells. Drop of the access speed during reading, caused by the ECC processing, can be suppressed.

The above embodiment illustrates a variable resistance memory, in which the memory cells are formed in a two-dimensional array. Nevertheless, the reading method of the disclosure may also be applied to a variable resistance memory with memory cells formed in a three-dimensional structure. Furthermore, the reading method of the disclosure may also be applied to semiconductor memory devices other than the variable resistance memory, such as a NOR type flash memory capable of random access.

Although exemplary embodiments of the disclosure have been described in detail above, the disclosure is not limited to specific embodiments, and various modifications and changes may be made within the scope of the disclosure defined in the claims.

What is claimed is:

1. A semiconductor memory device, comprising:
 a memory array comprising a plurality of memory cells;
 a plurality of word lines, extending along a row direction, wherein each of the plurality of memory cells is connected to one of the plurality of word lines;
 a plurality of bit lines and a plurality of source lines, extending along a column direction, wherein each of the plurality of memory cells is connected to one of the plurality of bit lines and one of the plurality of source lines;
 a writing part writing identical data to a pair of memory cells selected from the plurality of memory cells by controlling a pair of word lines selected from the plurality of word lines, a pair of bit lines selected from the plurality of bit lines and a pair of source lines selected from the plurality of source lines; and
 a reading part reading the data stored in the pair of memory cells selected from the plurality of memory cells by controlling the pair of word lines, the pair of bit lines and the pair of source lines,
 wherein the reading part comprises a sense amplifier that compares a total of currents respectively flowing through the pair of memory cells via the pair of bit lines with a reference value and outputs the data based on a comparison result.

2. The semiconductor memory device according to claim 1, wherein the writing part writes the identical data to a pair of memory cells adjacent in the row direction.

3. The semiconductor memory device according to claim 1, wherein each of the memory cells comprises a reversible and non-volatile variable resistance element and an access transistor connected to the variable resistance element, and the writing part sets or resets each variable resistance element of the pair of memory cells.

4. The semiconductor memory device according to claim 1, wherein the memory array comprises a dummy memory cell for generating the reference value.

5. The semiconductor memory device according to claim 4, wherein the dummy memory cell is set to generate a current between a current flowing through a set variable resistance element and a current flowing through a reset variable resistance element.

6. The semiconductor memory device according to claim 1, further comprising a setting part that sets the reference value according to a retention characteristic or an endurance characteristic.

7. The semiconductor memory device according to claim 1, comprising a row selection part selecting the memory cells in the row direction based on address information and a column selection part selecting the memory cells in the column direction based on the address information,
   wherein the writing part writes identical data to a pair of memory cells selected by the row selection part and the column selection part, and
   the reading part reads data stored in a pair of memory cells selected by the row selection part and the column selection part.

8. A reading method for reading data of a semiconductor memory device, the reading method comprising:
   writing identical data to a pair of memory cells selected from a plurality of memory cells included in a memory cell array, wherein the memory cell array are connected with a plurality of word lines, a plurality of bit lines and a plurality of source lines, each memory cell in the memory cell array is connected to one of the plurality of word lines, one of the plurality of bit lines and one of the plurality of source lines, and the pair of memory cells are written through a pair of bit lines selected from the plurality of bit lines and a pair of source lines selected from the plurality of source lines; and
   comparing a total of currents respectively flowing through the pair of memory cells via the pair of bit lines with a reference value and outputting data based on a comparison result when reading the data from the pair of memory cells.

9. The reading method according to claim 8, wherein each of the memory cells comprises a reversible and non-volatile variable resistance element and an access transistor connected to the variable resistance element.

10. The reading method according to claim 8, wherein each of the memory cells comprises a variable resistance element, and the reference value is set to a current between a current flowing through a set variable resistance element and a current flowing through a reset variable resistance element.

11. The reading method according to claim 9, wherein the reference value is varied according to a retention characteristic or an endurance characteristic.

* * * * *